(12) United States Patent
Hoshino et al.

(10) Patent No.: US 8,518,730 B2
(45) Date of Patent: *Aug. 27, 2013

(54) SAPPHIRE WAFER DIVIDING METHOD

(75) Inventors: Hitoshi Hoshino, Ota-ku (JP); Hiroumi Ueno, Ota-ku (JP); Yuji Nitta, Ota-ku (JP); Takashi Okamura, Ota-ku (JP)

(73) Assignee: Disco Corporation, Tokyo (JP)

( * ) Notice: Subject to any disclaimer, the term of this patent is extended or adjusted under 35 U.S.C. 154(b) by 79 days.

This patent is subject to a terminal disclaimer.

(21) Appl. No.: 13/238,887

(22) Filed: Sep. 21, 2011

(65) Prior Publication Data

US 2012/0083059 A1    Apr. 5, 2012

(30) Foreign Application Priority Data

Sep. 30, 2010    (JP) .................................. 2010-221565

(51) Int. Cl.
*H01L 21/00*    (2006.01)

(52) U.S. Cl.
USPC ............... 438/33; 438/22; 438/463; 438/479; 438/31; 438/108; 257/98; 257/94; 257/79; 257/82; 257/772

(58) Field of Classification Search
USPC ............... 438/33, 22, 463, 479, 31, 108, 200, 438/25, 28, 507, 42, 47, 401; 257/772, 79, 257/98, 82, 94

See application file for complete search history.

(56) References Cited

U.S. PATENT DOCUMENTS

| 2007/0134833 A1* | 6/2007 | Ikemoto et al. .................. 438/33 |
| 2010/0270548 A1* | 10/2010 | Ikemoto et al. .................. 257/43 |

FOREIGN PATENT DOCUMENTS

| JP | 10-056203 | 2/1998 |
| JP | 10-305420 | 11/1998 |
| JP | 3408805 | 3/2003 |

* cited by examiner

*Primary Examiner* — Telly Green
(74) *Attorney, Agent, or Firm* — Greer, Burns & Crain, Ltd

(57) ABSTRACT

A sapphire wafer dividing method including a cut groove forming step of forming a plurality of cut grooves on the back side of a sapphire wafer along a plurality of crossing division lines formed on the front side where a light emitting layer is formed, a modified layer forming step of forming a plurality of modified layers inside the sapphire wafer along the division lines, and a dividing step of dividing the sapphire wafer into individual light emitting devices along the modified layers as a division start point, thereby chamfering the corners of the back side of each light emitting device owing to the formation of the cut grooves in the cut groove forming step.

3 Claims, 9 Drawing Sheets

| Blade width [μm] | Depth of cut 10 [μm] Fixed | | |
|---|---|---|---|
| | 33 | 50 | 80 |
| N 1 | 102.80% | 104.12% | 106.37% |
| N 2 | 102.75% | 103.89% | 104.93% |
| N 3 | 102.87% | 104.48% | 103.77% |
| Avg. | 102.81% | 104.16% | 105.02% |

SAPPHIRE WAFER DIVIDING METHOD

BACKGROUND OF THE INVENTION

1. Field of the Invention

The present invention relates to a dividing method for dividing a light emitting device wafer into individual light emitting devices, and more particularly to a dividing method for dividing a sapphire wafer.

2. Description of the Related Art

A light emitting device such as a light emitting diode (LED) having a sapphire layer and a light emitting layer formed on the front side of the sapphire layer is known (see Japanese Patent Laid-open No. Hei 10-056203, for example). This light emitting device is manufactured by dividing a sapphire wafer into a plurality of pieces along a plurality of crossing division lines, wherein the sapphire wafer is composed of a sapphire substrate and a light emitting layer formed on the front side of the sapphire substrate. As a dividing method for a light emitting device wafer such as a sapphire wafer, a dividing method using laser processing is known (see Japanese Patent Laid-open No. Hei 10-305420 and Japanese Patent No. 3408805, for example).

According to the dividing method described in Japanese Patent Laid-open No. Hei 10-305420, a pulsed laser beam is applied to the wafer to form a plurality of laser processed grooves on the front side of the wafer along the division lines, and an external force is next applied to the laser processed grooves to divide the wafer. According to the dividing method described in Japanese Patent No. 3408805, a pulsed laser beam having a transmission wavelength is applied to the wafer to form a plurality of continuous modified layers inside the wafer along the division lines, and an external force is applied to the modified layers reduced in strength to divide the wafer.

SUMMARY OF THE INVENTION

In the light emitting device mentioned above, light emitted from the light emitting layer into the sapphire layer is emerged from the sapphire layer to the ambient air. However, since the refractive index of sapphire is remarkably larger than that of air, there is a problem such that the light is not efficiently emerged from the sapphire layer. This is due to the fact that when the angle of incidence of light upon the interface between the sapphire layer and the air is greater than a critical angle)(34.5°), total reflection occurs on this interface, causing confinement of the light inside the sapphire layer.

It is therefore an object of the present invention to provide a dividing method which can improve the luminance of the light emitting device formed by dividing a sapphire wafer.

In accordance with an aspect of the present invention, there is provided a sapphire wafer dividing method for dividing a sapphire wafer along a plurality of crossing division lines, the sapphire wafer having a light emitting layer on the front side, the light emitting layer being partitioned by the division lines to define a plurality of regions where a plurality of light emitting devices are respectively formed, the sapphire wafer dividing method including a modified layer forming step of applying a laser beam having a transmission wavelength to the sapphire wafer from the back side of the sapphire wafer along the division lines to thereby form a plurality of modified layers inside the sapphire wafer along the division lines; a cut groove forming step of cutting the sapphire wafer from the back side thereof by using a cutting blade to thereby form a plurality of cut grooves along the division lines, thereby chamfering each light emitting device; and a dividing step of dividing the sapphire wafer into the individual light emitting devices along the division lines from the modified layers as a division start point after performing the modified layer forming step and the cut groove forming step.

With this configuration, the cut grooves are formed on the back side of the sapphire wafer along the division lines in the cut groove forming step, thereby chamfering the corners of the back side of each light emitting device divided from the sapphire wafer in the dividing step. By performing this chamfering, a polyhedral surface is formed on the back side of each light emitting device, so that the light reflected in the device is easily incident on the polyhedral surface at an angle less than or equal to the critical angle. Accordingly, the light emitted from the light emitting layer of each device can be easily emerged to the outside, thereby improving the luminance of each light emitting device. The chamfering to be performed in the present invention is not limited to forming the corners of each light emitting device into slant surfaces, but includes forming the corners of each light emitting device into any shape such as curved surfaces capable of suppressing the preservation of a reflected angle.

Preferably, the sapphire wafer dividing method further includes a preliminary groove forming step of performing ablation by applying a laser beam having an absorption wavelength to the sapphire wafer before performing the cut groove forming step to thereby form a plurality of preliminary grooves from the back side of the sapphire wafer along the division lines.

According to the present invention, the cut grooves are formed on the sapphire wafer along the division lines, and the sapphire wafer is next divided into the individual light emitting devices along the cut grooves, so that the light emitted from the light emitting layer of each light emitting device can be easily emerged to the outside to improve the luminance.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

The division of a sapphire wafer using a dividing method according to a preferred embodiment of the present invention is carried out by sequentially performing a cut groove forming step by a cutting apparatus, a modified layer forming step by a laser processing apparatus, and a dividing step by a tape expanding apparatus. In the cut groove forming step, the back side of the sapphire wafer having a light emitting layer on the front side is cut to form cut grooves along division lines. In the modified layer forming step, modified layers are formed inside the sapphire wafer along the division lines.

In the dividing step, a dicing tape attached to the front side of the sapphire wafer is expanded to thereby divide the sapphire wafer into individual light emitting devices. Each light emitting device obtained by performing these steps is characterized in that the corners of the back side of each light emitting device are chamfered by the cut grooves formed in the cut groove forming step, so that light emitted from the light emitting layer formed on the front side of each light emitting device can be easily emerged. The configuration of the apparatus used in each step in this preferred embodiment will now be described with reference to the attached drawings.

Figure 1:
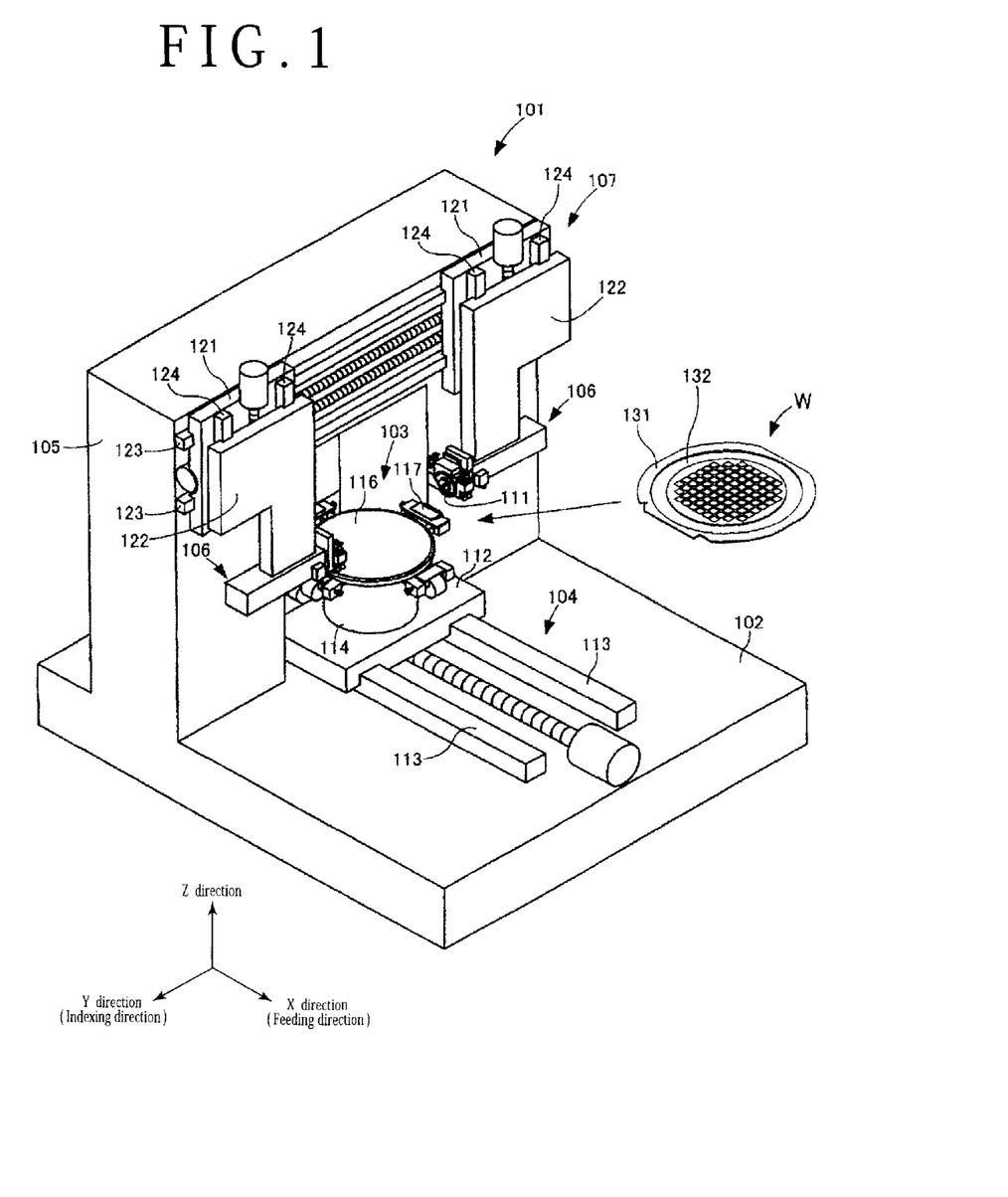
FIG. 1 is a perspective view of a cutting apparatus for performing a cut groove forming step in the dividing method according to the present invention.

Referring to FIG. 1, there is shown a perspective view of a cutting apparatus 101 for forming cut grooves on a sapphire wafer W according to a preferred embodiment of the present invention. The configuration of the cutting apparatus used in the dividing method of the present invention is not limited to the configuration shown in FIG. 1, but may be any configuration provided that cut grooves can be formed on the sapphire wafer W. As shown in FIG. 1, the cutting apparatus 101 is configured so as to cut the sapphire wafer W by relatively moving a pair of blade units 106 each having a cutting blade 111 and a chuck table 103 holding the sapphire wafer W. The sapphire wafer W is substantially circular in shape, and it is composed of a sapphire ($Al_2O_3$) substrate and a light emitting layer formed on the front side of the sapphire substrate. The light emitting layer is partitioned into a plurality of regions by a plurality of crossing division lines, and a light emitting device is formed in each region.

The sapphire wafer W is attached to a dicing tape 132 supported to an annular frame 131 in the condition where the light emitting layer formed on the front side of the sapphire substrate is oriented downward to adhere to the dicing tape 132. Although the sapphire wafer W is used as a light emitting device wafer in this preferred embodiment, the light emitting device wafer is not limited to the sapphire wafer W according to the present invention. For example, the configuration of the light emitting device wafer is not limited to the configuration that a light emitting layer is formed on a sapphire substrate, but may be any configuration such that a light emitting layer is formed on a GaAs (gallium arsenide) substrate or a SiC (silicon carbide) substrate.

The cutting apparatus 101 has a base 102 and a chuck table moving mechanism 104 provided on the base 102 for feeding the chuck table 103 in the X direction. A gantry-shaped column portion 105 is formed on the base 102 so as to straddle the chuck table moving mechanism 104. The column portion 105 is provided with a blade unit moving mechanism 107 for indexing the pair of blade units 106 in the Y direction above the chuck table 103.

The chuck table moving mechanism 104 has an X-axis table 112 for supporting the chuck table 103 thereon. The X-axis table 112 is supported to a pair of parallel guide rails 113 extending in the X direction on the upper surface of the base 102. The X-axis table 112 is movable in the X direction by a ball screw type moving mechanism.

The chuck table 103 has a θ table 114 supported to the upper surface of the X-axis table 112 so as to be rotatable about the Z axis and a work holding member 116 provided on the upper end of the θ table 114 for holding the sapphire wafer W under suction. The work holding member 116 is a circular member having a predetermined thickness and has a suction holding surface formed of a porous ceramic material at a central portion on the upper surface. This suction holding surface functions to hold the sapphire wafer W through the dicing tape 132 under suction, and is connected through a pipe provided in the θ table 114 to a vacuum source.

Four clamps 117 are provided around the work holding member 116 so as to be supported through a pair of support arms extending radially outward from the outer circumference of the θ table 114. These four clamps 117 are driven by an air actuator to hold the annular frame 131 supporting the sapphire wafer W through the dicing tape 132.

The blade unit moving mechanism 107 has a pair of Y-axis tables 121 movable in the Y direction relative to the front side of the column portion 105 and a Z-axis table 122 movable in the Z direction relative to the front side of each Y-axis table 121. The pair of blade units 106 are provided at the lower ends of the pair of Z-axis tables 122, respectively. Each Y-axis table 121 is supported to a pair of parallel guide rails 123 extending in the Y direction on the front side of the column portion 105. Each Y-axis table 121 is movable in the Y direction by a ball screw type moving mechanism. Each Z-axis table 122 is supported to a pair of parallel guide rails 124 extending in the Z direction on the front side of each Y-axis table 121. Each Z-axis table 122 is movable in the Z direction by a ball screw type moving mechanism.

Each blade unit 106 has a circular cutting blade 111 provided at the front end of a spindle rotating about the Y axis and a plurality of nozzles (not shown) for spraying a cutting water to a portion to be cut. Each blade unit 106 is operated so that the cutting blade 111 is rotated at a high speed by the spindle and the cutting water is sprayed from the plural nozzles to the portion to be cut, thereby cutting the sapphire wafer W.

The cutting operation by the cutting apparatus 101 will now be described. First, the sapphire wafer W is placed on the chuck table 103 and the chuck table 103 is next moved to a cutting position below the cutting blades 111. Thereafter, the cutting edge of either cutting blade 111 is aligned to a predetermined one of the division lines of the sapphire wafer W. Thereafter, the corresponding blade unit 106 is lowered to bring the cutting edge rotating at a high speed into cut in the sapphire wafer W by a predetermined depth from the back side of the sapphire wafer W.

When the sapphire wafer W is cut by the cutting blade 111 as mentioned above, the chuck table 103 is fed in the X direction to thereby form a cut groove 401 (see FIG. 5A) on the back side of the sapphire wafer W along the predetermined division line. Thereafter, the cutting blade 111 is indexed in the Y direction by the pitch of the division lines and a cutting operation is similarly performed to form another cut groove 401 along the division line adjacent to the predetermined division line mentioned above. This operation is repeated to form a plurality of cut grooves 401 along all of the division lines extending in a first direction.

Thereafter, the chuck table 103 is rotated 90° by the θ table 114 to form a plurality of cut grooves 401 along all of the other division lines extending in a second direction perpendicular to the first direction mentioned above. Thus, the cut grooves 401 are formed on the back side of the sapphire wafer W along all of the crossing division lines extending in the first and second directions. Thereafter, the sapphire wafer W is removed from the chuck table 103 and next transported to a laser processing apparatus 201 shown in FIG. 2. The cutting apparatus 101 may be configured so that ultrasonic vibrations are transmitted to the cutting edge of each cutting blade 111 in cutting the sapphire wafer W, thereby reducing a cutting load to the sapphire wafer W.

Figure 2:
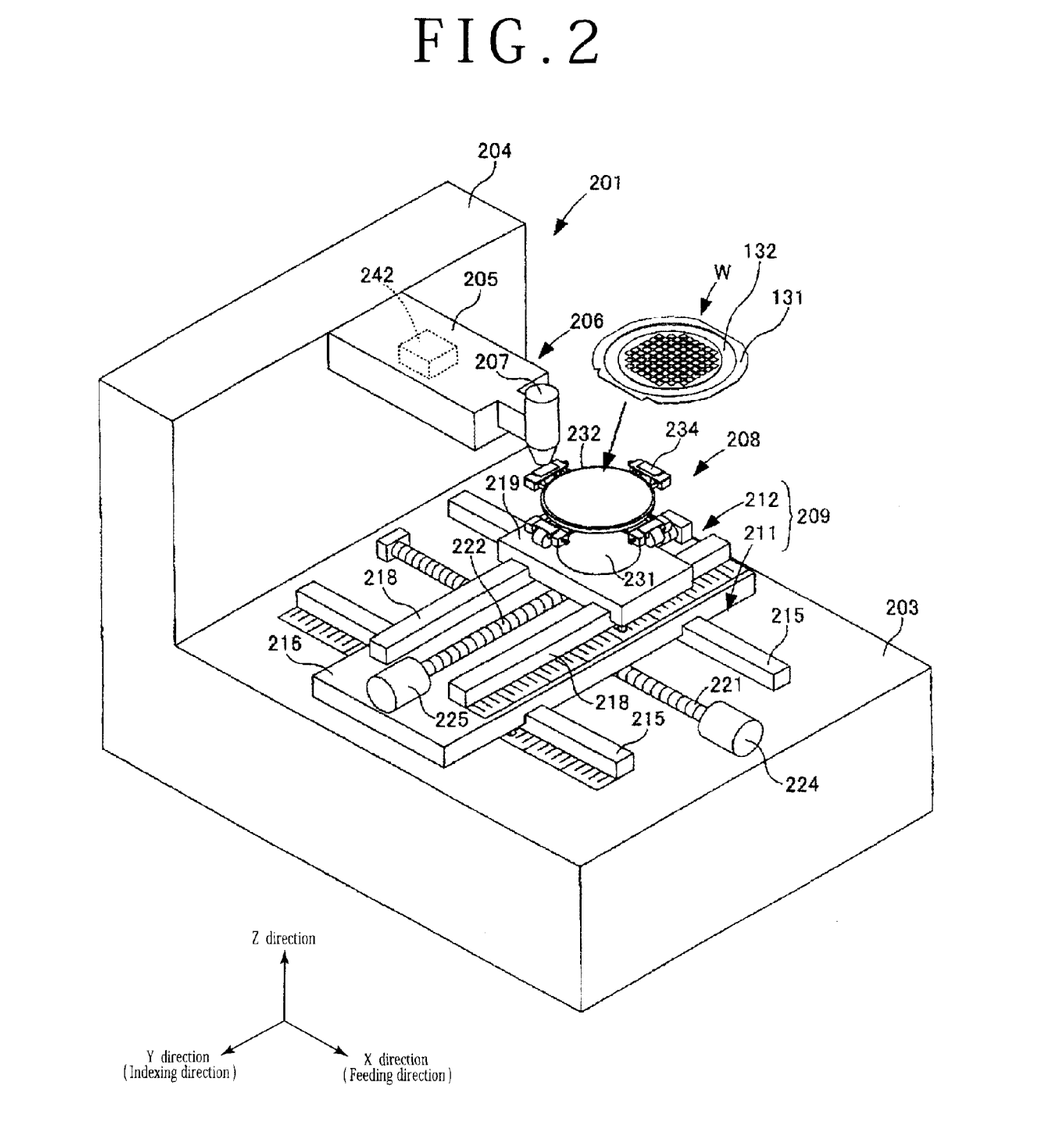
FIG. 2 is a perspective view of a laser processing apparatus for performing a modified layer forming step in the dividing method according to the present invention.

Referring to FIG. 2, there is shown a perspective view of a laser processing apparatus 201 for forming modified layers inside the sapphire wafer W according to a preferred embodiment of the present invention. The configuration of the laser processing apparatus used in the dividing method of the present invention is not limited to the configuration shown in FIG. 2, but may be any configuration provided that modified layers can be formed inside the sapphire wafer W.

As shown in FIG. 2, the laser processing apparatus 201 is configured so as to process the sapphire wafer W by relatively moving a laser processing unit 206 for applying a laser beam to the sapphire wafer W and a chuck table 208 holding the sapphire wafer W. The laser processing apparatus 201 has a boxlike bed portion 203 and a column portion 204 formed on the upper surface of the bed portion 203 at its rear end. An arm portion 205 projects from the front surface of the column portion 204, and a laser head 207 constituting the laser processing unit 206 is provided at the front end of the arm portion 205.

A chuck table moving mechanism 209 for feeding the chuck table 208 in the X direction and indexing the chuck table 208 in the Y direction is provided on the upper surface of the bed portion 203. The chuck table moving mechanism 209 is composed of a feeding mechanism 211 for feeding the chuck table 208 in the X direction and an indexing mechanism 212 for indexing the chuck table 208 in the Y direction. The feeding mechanism 211 has an X-axis table 216 movable in the X direction relative to the bed portion 203. The X-axis table 216 is supported to a pair of parallel guide rails 215 extending in the X direction on the upper surface of the bed portion 203. The X-axis table 216 is movable in the X direction by a ball screw type moving mechanism.

The indexing mechanism 212 has a Y-axis table 219 movable in the Y direction relative to the X-axis table 216. The Y-axis table 219 is supported to a pair of parallel guide rails 218 extending in the Y direction on the upper surface of the X-axis table 216. The Y-axis table 219 is movable in the Y direction by a ball screw type moving mechanism. The chuck table 208 is provided on the upper surface of the Y-axis table 219.

The chuck table 208 has a θ table 231 supported to the upper surface of the Y-axis table 219 so as to be rotatable about the Z axis and a work holding member 232 provided on the upper end of the θ table 231 for holding the sapphire wafer W under suction. The work holding member 232 is a circular member having a predetermined thickness and has a suction holding surface formed of a porous ceramic material at a central portion on the upper surface. This suction holding surface functions to hold the sapphire wafer W through the dicing tape 132 under suction, and is connected through a pipe provided in the θ table 231 to a vacuum source.

Four clamps 234 are provided around the work holding member 232 so as to be supported through a pair of support arms extending radially outward from the outer circumference of the θ table 231. These four clamps 234 are driven by an air cylinder to hold the annular frame 131 supporting the sapphire wafer W through the dicing tape 132.

The laser processing unit 206 has the laser head 207 provided at the front end of the arm portion 205. An optical system of the laser processing unit 206 is provided in the arm portion 205 and the laser head 207. The laser head 207 includes a focusing lens for focusing a laser beam oscillated from an oscillator 242 to laser-process the sapphire wafer W held on the chuck table 208. The laser beam has a transmission wavelength to the sapphire wafer W, and the focal point of the laser beam is set inside the sapphire wafer W by the optical system.

By the operation of the laser beam applied from the laser head 207 to the sapphire wafer W, a modified layer 402 (see FIG. 5B) as a division start point is formed inside the sapphire wafer W along each division line. Each modified layer 402 means a region different from its ambient region in density, refractive index, mechanical strength, or any other physical properties in the sapphire wafer W due to the application of the laser beam, causing a reduction in strength as compared with the ambient region. Examples of each modified layer 402 includes a melted region, cracked region, breakdown region, and refractive index changed region. These regions may be present in a mixed condition.

The laser processing operation by the laser processing apparatus 201 will now be described. First, the sapphire wafer W is placed on the chuck table 208 and the chuck table 208 is next moved to a processing position below the laser head 207. Thereafter, a laser beam outlet of the laser head 207 is aligned to a predetermined one of the division lines (the cut grooves 401) of the sapphire wafer W, and the focal point of the laser beam to be applied from the laser head 207 is set inside the sapphire wafer W. In this condition, laser processing is started.

That is, the laser beam is applied to the sapphire wafer W and the chuck table 208 holding the sapphire wafer W is fed in the X direction to thereby form a modified layer 402 inside the sapphire wafer W along the predetermined cut groove 401. Thereafter, the chuck table 208 is indexed in the Y direction by the pitch of the division lines and a laser processing operation is similarly performed to form another modified layer 402 along the cut groove 401 adjacent to the predetermined cut groove 401 mentioned above. This operation is repeated to form a plurality of modified layers 402 along all of the cut grooves 401 extending in the first direction mentioned above.

Thereafter, the chuck table 208 is rotated 90° by the θ table 231 to form a plurality of modified layers 402 along all of the other cut grooves 401 extending in the second direction perpendicular to the first direction. Thus, the modified layers 402 are formed inside the sapphire wafer W along all of the crossing cut grooves 401 extending in the first and second directions. Thereafter, the sapphire wafer W is removed from the chuck table 208 and next transported to a tape expanding apparatus 301 shown in FIG. 3.

Figure 3:
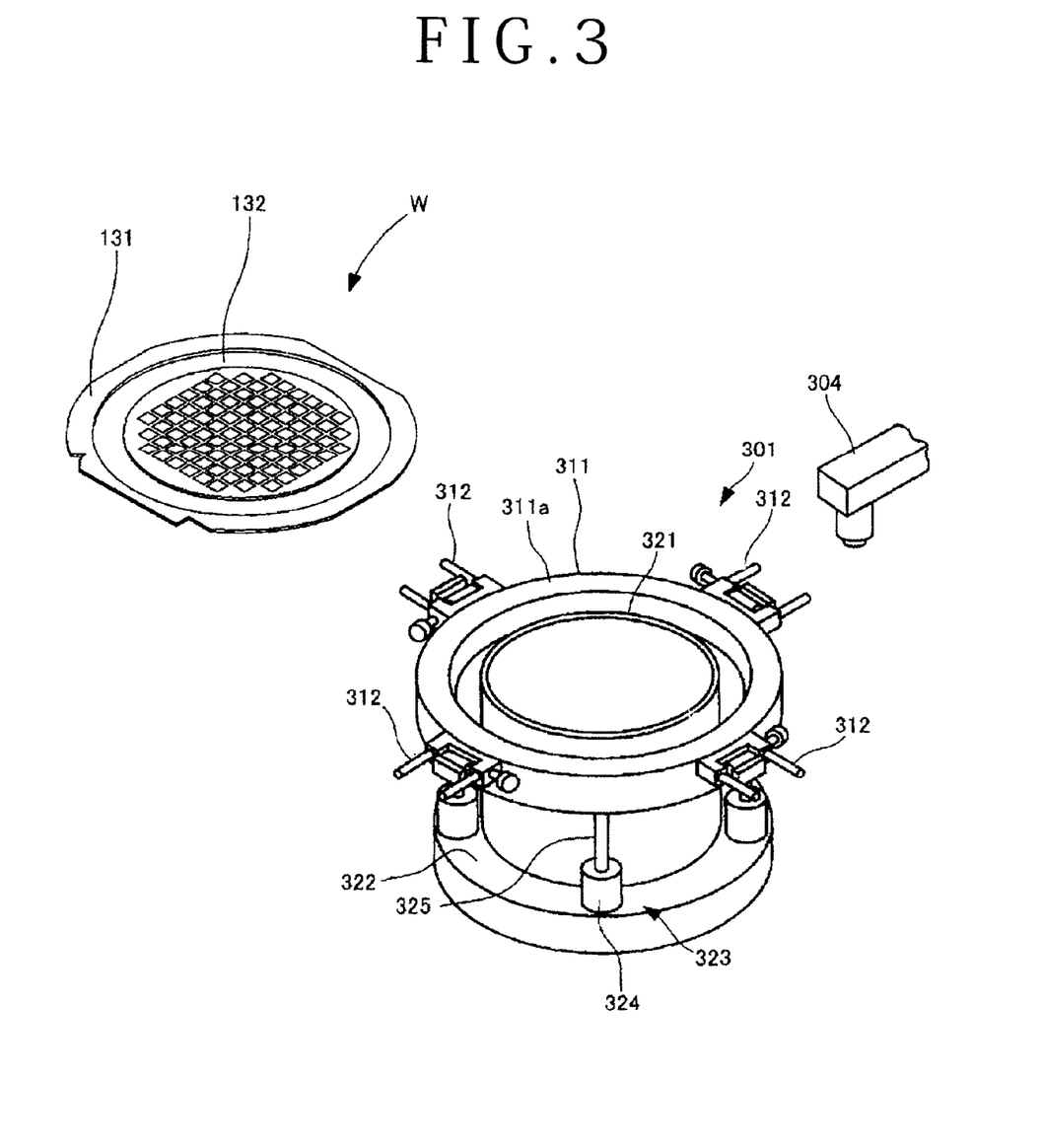
FIG. 3 is a perspective view of a tape expanding apparatus for performing a dividing step in the dividing method according to the present invention.

Referring to FIG. 3, there is shown a perspective view of a tape expanding apparatus 301 for expanding the dicing tape 132 to thereby divide the sapphire wafer W into the individual light emitting devices according to a preferred embodiment of the present invention. The configuration of the tape expanding apparatus used in the dividing method of the present invention is not limited to the configuration shown in FIG. 3, but may be any configuration provided that the sapphire wafer W can be divided by expanding the dicing tape 132.

As shown in FIG. 3, the tape expanding apparatus 301 is configured so as to divide the sapphire wafer W by using an expanding drum 321 to expand the dicing tape 132 attached to the sapphire wafer W. The tape expanding apparatus 301 has a circular base 322 and the expanding drum 321 provided on the upper surface of the circular base 322 at its central portion. Four vertical moving mechanisms 323 for vertically moving an annular table 311 for holding the sapphire wafer W are provided on the upper surface of the circular base 322 at its peripheral portion around the expanding drum 321.

Each vertical moving mechanism 323 is configured by an air cylinder having a cylinder case 324 and a piston rod 325 projecting upwardly from the cylinder case 324. The piston rod 325 is connected at its upper end to the lower surface of the annular table 311. The annular table 311 has a mounting surface 311a for mounting the annular frame 131 supporting the sapphire wafer W through the dicing tape 132, thereby positioning the sapphire wafer W above the expanding drum 321. Four clamps 312 for fixing the annular frame 131 are provided on the circumferential surface of the annular table 311.

The expanding drum 321 has an outer diameter smaller than the inner diameter of the annular frame 131 and an inner diameter larger than the outer diameter of the sapphire wafer W attached to the dicing tape 132. Accordingly, the upper end of the expanding drum 321 is adapted to abut against an annular area of the dicing tape 132 defined between the outer circumference of the sapphire wafer W and the inner circumference of the annular frame 131. By the abutment of the expanding drum 321 against the dicing tape 132, a tensile force is applied to the dicing tape 132 to thereby divide the sapphire wafer W along the modified layers 402.

The dividing operation by the tape expanding apparatus 301 will now be described. First, the sapphire wafer W is fixed to the annular table 311, and the annular table 311 is next lowered by the four vertical moving mechanisms 323. At this time, the upper end of the expanding drum 321 abuts against the annular area of the dicing tape 132, so that a tensile force is rapidly applied to the dicing tape 132. Accordingly, the sapphire wafer W is divided along the modified layers 402 as a division start point to obtain the individual light emitting devices 411 (see FIG. 5C). Each light emitting device 411 is picked up under suction by a pickup collet 304 and peeled off from the dicing tape 132.

Figure 4A:
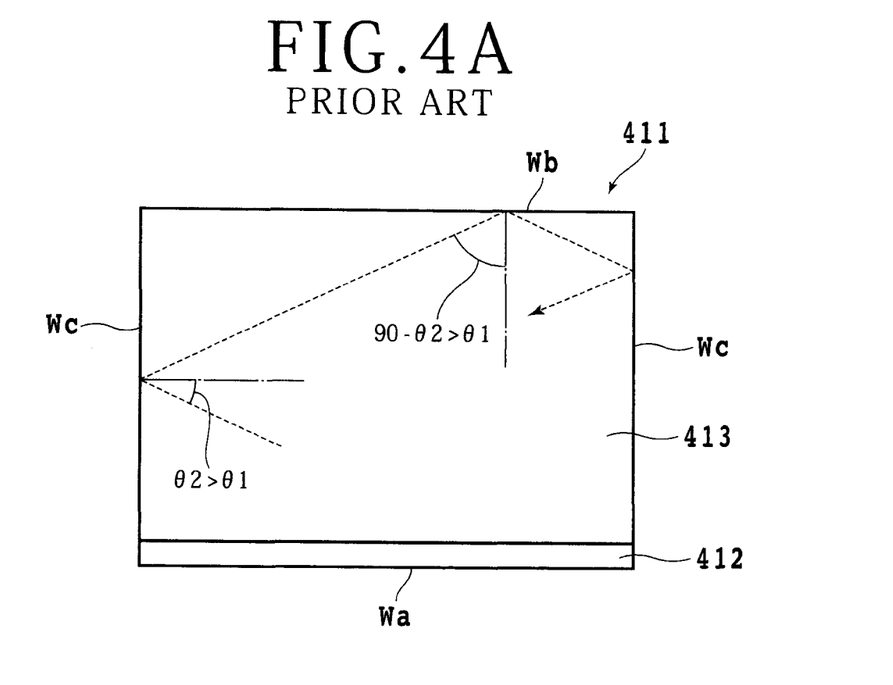
FIG. 4A is a side view of a light emitting device obtained by a dividing method in the prior art.
Figure 4B:
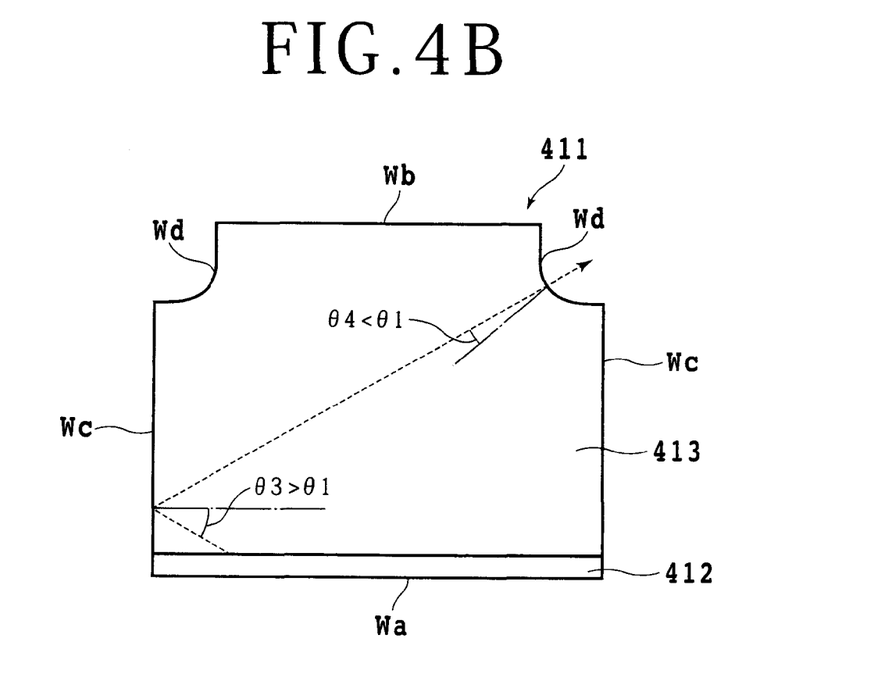
FIG. 4B is a side view of a light emitting device obtained by the dividing method of the present invention.

As shown in FIG. 4B, each light emitting device 411 has a substantially boxlike shape, and four chamfered portions Wd are formed at the four corners between the back surface Wb and the four side surfaces Wc (broken surfaces). In FIGS. 4A and 4B, the broken line denotes a ray of light emitted from a light emitting layer 412 of each light emitting device 411, and the dot & dash line denotes a normal to the interface between a sapphire layer 413 of each light emitting device 411 and the ambient air. Each chamfered portion Wd is formed by dividing each cut groove 401 of the sapphire wafer W. By the formation of each chamfered portion Wd, the light emitted from the light emitting layer 412 can be easily emerged from the sapphire layer 413 to the ambient air, thereby improving the luminance of each light emitting device 411. The light reflected on the side surfaces Wc and the back surface Wb is not reflected on the chamfered portions Wd, but is passed therethrough.

More specifically, when the light emitted from the light emitting layer 412 is incident on one of the side surfaces Wc in the sapphire layer 413 as shown by the broken line in FIG. 4B, the critical angle $\theta_1$ allowing the light to pass through this side surface Wc is 34.5° with respect to the normal shown by the dot & dash line in FIG. 4B. If the light is incident on the side surface Wc at an angle less than or equal to the critical angle $\theta_1$, the light is not totally reflected on the side surface Wc. However, if the light is incident on the side surface Wc at an angle greater than the critical angle $\theta_1$, the light is totally reflected on the side surface Wc. In each light emitting device 411 shown in FIG. 4B, the back surface Wb is so formed as to have a polyhedral shape by the formation of the chamfered portions Wd, so that the preservation of an incident angle is inhibited at the chamfered portions Wd to reduce the repetition of total reflection at an incident angle greater than the critical angle.

In the case of a boxlike light emitting device 411 having no chamfered portions shown in FIG. 4A, there is a case that when light is incident on one of the side surfaces Wc at an angle greater than the critical angle $\theta_1$, a reflective angle is preserved to repeat total reflection in the sapphire layer 413. For example, there is a case that light is incident on the side surface Wc at an incident angle $\theta_2$ greater than the critical angle $\theta_1$, the light totally reflected on the side surface Wc is next incident on the back surface Wb at an incident angle $(90-\theta_2)$ greater than the critical angle $\theta_1$, and the light is totally reflected on the back surface Wb as shown in FIG. 4A. In this case, the incidence of the light on the interface of the light emitting device 411 at the incident angle $\theta_2$ and the incident angle $(90-\theta_2)$ is repeated, so that total reflection on the interface is repeated to cause a problem such that the light may finally disappear in the sapphire layer 413.

On the other hand, in the boxlike light emitting device 411 having the chamfered portions Wd obtained by the dividing method of the present invention as shown in FIG. 4B, the light emitted from the light emitting layer 412 is easily incident on the interface at an angle less than or equal to the critical angle $\theta_1$ owing to the formation of the chamfered portions Wd. For example, there is a case that light is incident on the side surface Wc at an incident angle $\theta_3$ greater than the critical angle $\theta_1$, and the light totally reflected on the side surface Wc is next incident on one of the chamfered portions Wd at an incident angle $\theta_4$ less than the critical angle $\theta_1$ as shown in FIG. 4B. Further, in the case that the light is reflected on the chamfered portion Wd at an angle greater than the critical angle $\theta_1$, the light reflected on the chamfered portion Wd is easily incident on the side surface Wc or the back surface Wb at an angle less than or equal to the critical angle $\theta_1$. Thus, even when the light is incident on the side surface Wc or the back surface Wb at an angle greater than the critical angle $\theta_1$, the preservation of the angle of reflection at the chamfered portion Wd is inhibited.

In this manner, the repetition of the total reflection of light in the sapphire layer 413 can be reduced by the formation of the chamfered portions Wd, so that the amount of light emerging from the sapphire layer 413 can be increased. In other words, an escape cone of each light emitting device 411 (an area where the light emitted from an arbitrary light emitting point can pass through the interface between the sapphire layer 413 and the ambient air) can be enlarged. Thus, each light emitting device 411 according to this preferred embodiment is improved in luminance owing to chamfering of the back surface Wb.

Figure 5A:
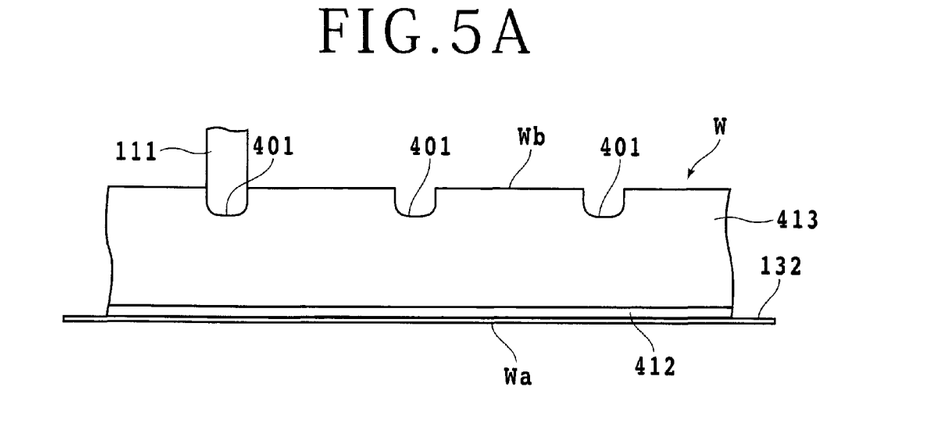
FIGS. 5A to 5C are side views for illustrating the dividing method according to the present invention.

The flow of the dividing method according to this preferred embodiment will now be described with reference to FIGS. 5A to 6. FIGS. 5A to 5C illustrate the dividing method according to this preferred embodiment, and FIG. 6 illustrates the relation between blade width and laser spot diameter according to this preferred embodiment. As shown in FIG. 5A, the cut groove forming step is first performed by the cutting apparatus 101. For example, the cutting operation is performed under the conditions where the rotational speed of the cutting blade 111 is set to 20000 rpm and the feed speed of the chuck table 103 is set to 100 mm/sec. In the cut groove forming step, the cut grooves 401 are formed along the division lines on the back surface Wb of the sapphire wafer W having the light emitting layer 412 on the front side Wa. As the cutting blade 111, a cutting blade having a flat surface at the front end is used, so that the bottom surface of each cut groove 401 is formed as a flat surface. For example, the cutting blade 111 is provided by a blade formed by binding diamond abrasive grains with a nickel plating, wherein the diamond abrasive grains can be formed into the flat end surface of the cutting blade 111 and is hard to wear nonuniformly. Accordingly, a change in shape of the front end of the cutting blade 111 can be suppressed and the bottom surface of each cut groove 401 can be maintained flat.

The shape and width of the front end of the cutting blade 111 can be varied by the nickel plating. In particular, the front end of the cutting blade 111 is preferably formed as a flat surface having a width larger than the diameter of a laser spot to be formed on the bottom surface of each cut groove 401 in the next modified layer forming step. As shown in FIG. 6, each cut groove 401 formed by the cutting blade 111 has a flat surface 401a at the central portion on the bottom surface and a pair of curved surfaces 401b connecting the flat surface Wb of the sapphire wafer W, wherein the flat surface 401a has a width larger than the diameter of a laser spot to be formed on the bottom surface of each cut groove 401 in the next modified layer forming step. As described later in detail, the flat surface 401a contributes to the improvement in accuracy of each modified layer 402 in the modified layer forming step.

Each curved surface 401b has an external shape forming a reflective surface that can inhibit the preservation of a reflective angle, thereby contributing to the improvement in luminance of each light emitting device 411. Accordingly, the front end of the cutting blade 111 more preferably has a flat surface having substantially the same width as the diameter of a laser spot, so as to increase the range of each curved surface 401b of each cut groove 401. The surface to be formed on each side portion of the bottom surface of each cut groove 401 is not limited to such a curved surface, but may be a flat surface not parallel or not perpendicular to the back surface Wb of the sapphire wafer W (an inclined surface with respect to the back surface Wb).

If the grain size of the abrasive grains forming the cutting blade 111 is too large, the bottom surface of each cut groove 401 becomes rough, so that the laser beam used in the modified layer forming step is scattered on the bottom surface of each cut groove 401, causing a reduction in accuracy of each modified layer 402. On the other hand, if the grain size of the abrasive grains forming the cutting blade 111 is too small, the reflection causing the preservation of a reflective angle easily occurs on the bottom surface of each cut groove 401. Accordingly, the grain size of the abrasive grains forming the cutting blade 111 is set to preferably #1000 to #4000 (about 2 to 17 μm in diameter), more preferably #1500 to #3000 (about 3 to 9 μm in diameter), and further more preferably #1800 to #2500 (about 3 to 8 μm in diameter). While the cutting blade 111 is provided by a nickel plated blade using diamond abrasive grains in this preferred embodiment, the configuration of the cutting blade 111 is not limited to the above configuration, but may be any configuration capable of cutting the sapphire wafer W.

Figure 5B:
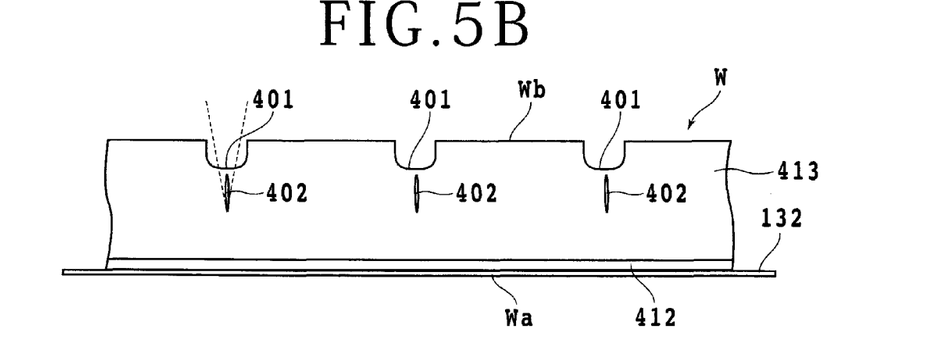
Figure 6:
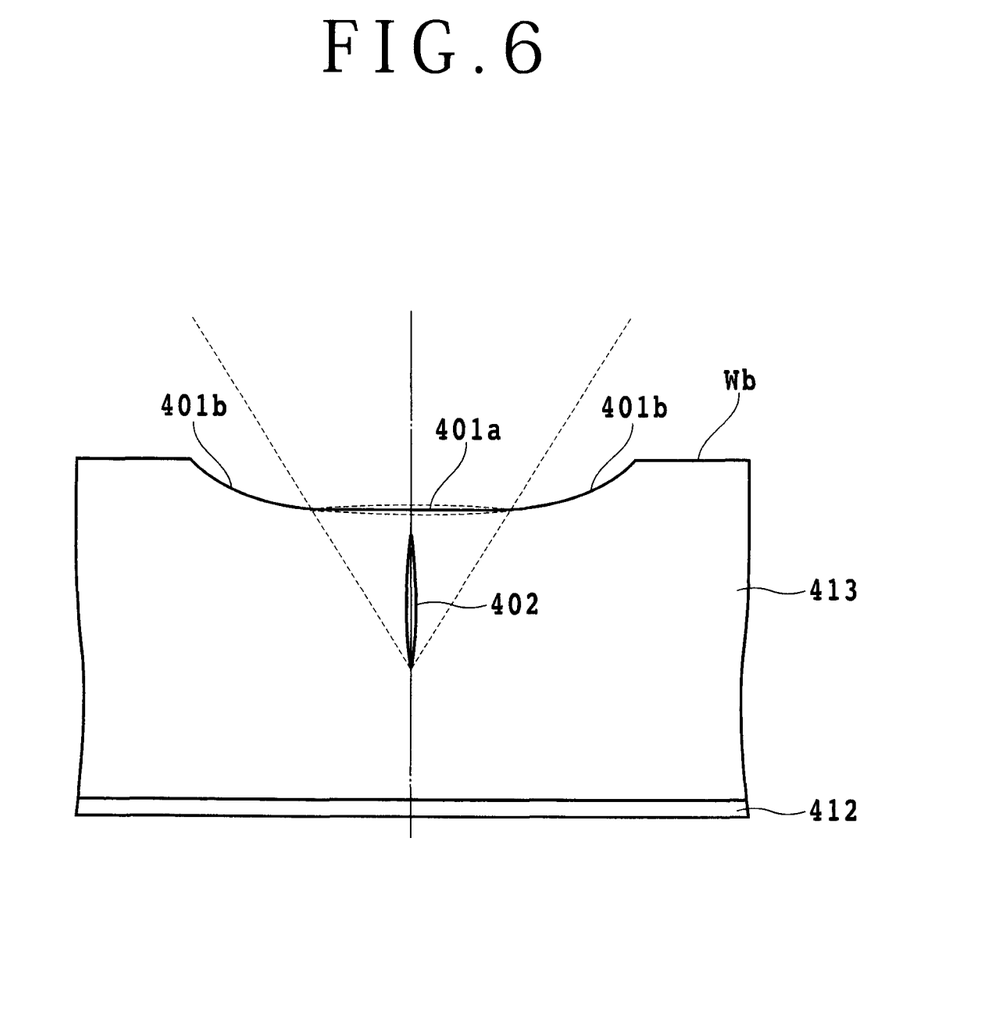
FIG. 6 is a side view for illustrating the relation between blade width and laser spot diameter.

As shown in FIG. 5B, the modified layer forming step is next performed by the laser processing apparatus 201. For example, the laser processing operation is performed under the conditions where a pulsed laser beam having a wavelength of 1064 nm, a power of 0.3 W, and a repetition frequency of 100 kHz is used as the laser beam. In the modified layer forming step, the focal point of the laser beam is set at a predetermined depth from the back surface Wb of the sapphire wafer W to form the modified layers 402 below the cut grooves 401 along the division lines. In the laser processing apparatus 201, the laser beam is focused through the flat surface 401a of each cut groove 401 into the sapphire wafer W, so that the refraction and reflection of the laser beam at the flat surface 401a can be reduced to thereby improve the focusing accuracy of the laser beam.

For example, the focal point of the laser beam is set at a depth of about 40 μm from the back surface Wb of the sapphire wafer W. In this case, each modified layer 402 having a height of about 25 μm from the focal point is formed in the sapphire wafer W below the corresponding cut groove 401. That is, a spacing is defined between each cut groove 401 and the corresponding modified layer 402, so that it is possible to prevent a quality degradation or cracking due to the connection of each cut groove 401 and the corresponding modified layer 402.

There is a case that the sapphire wafer W is partially divided in forming the modified layers 402. Accordingly, if the cut grooves 401 are formed after forming the modified layers 402, there is a possibility of degradation in quality of processing of the sapphire wafer W. In this preferred embodiment, the modified layer forming step is performed after performing the cut groove forming step, thereby suppressing such a degradation in quality of processing of the sapphire wafer W. However, the cut groove forming step may be performed after performing the modified layer forming step provided that the quality of processing of the sapphire wafer W is not degraded.

More specifically, if the sapphire wafer W is partially divided along any one of the division lines at the time the cut grooves 401 or the modified layers 402 have been formed, the processing in the next step is performed along this division line where the sapphire wafer W is partially divided or performed so as to straddle this division line where the sapphire wafer W is partially divided, so that the quality of this processing is degraded. To cope with this problem, each modified layer 402 is formed below the corresponding cut groove 401 so as to be spaced apart therefrom and/or the modified layer forming step is performed after performing the cut groove forming step in this preferred embodiment, thereby reducing the partial division of the sapphire wafer W along any one of the division lines at the time the cut grooves 401 or the modified layers 402 have been formed.

Figure 5C:
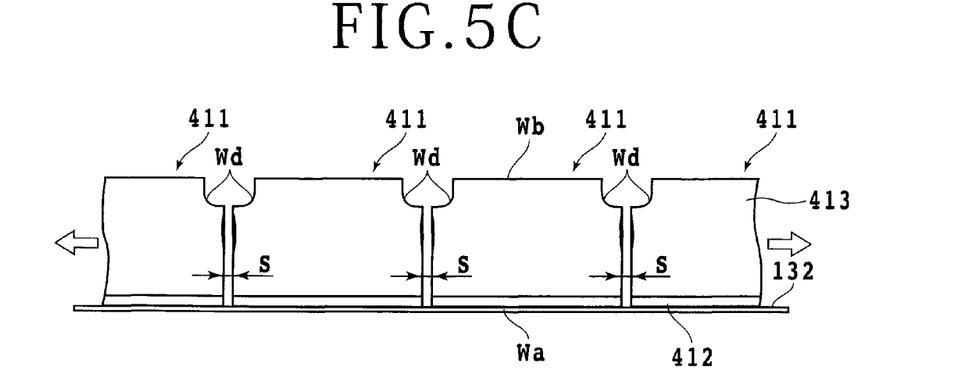

As shown in FIG. 5C, the dividing step is next performed by the tape expanding apparatus 301. In the dividing step, the annular table 311 holding the sapphire wafer W is lowered to relatively upwardly displace the upper end of the expanding drum 321 with respect to the mounting surface 311a of the annular table 311. As a result, the dicing tape 132 is pressed upward by the upper end of the expanding drum 321, and a tensile force is radially applied to the dicing tape 132. By the application of the tensile force to the dicing tape 132, an external force is applied to the modified layers 402 of the sapphire wafer W where the strength is reduced, so that the sapphire wafer W is divided along the modified layers 402 as a division start point to obtain the individual light emitting devices 411.

Each cut groove 401 is formed above the corresponding modified layer 402, so that each cut groove 401 is divided laterally with respect to the corresponding modified layer 402. Accordingly, the corners of the back surface of each light emitting device 411 becomes the chamfered portions Wd formed by the cut grooves 401 in the cut groove forming step. Thereafter, each light emitting device 411 divided from the sapphire wafer W is picked up under suction by the pickup collet 304 and peeled off from the dicing tape 132. As shown in FIG. 5C, a space S is defined between the adjacent light emitting devices 411, so that each light emitting device 411 can be easily picked up by the pickup collet 304 without the contact with its adjacent light emitting device 411. As described above, the corners of the back surface of each light emitting device 411 is chamfered, so that the light emitted from the light emitting layer 412 can be easily emerged from the sapphire layer 413 to the outside thereof. Thus, the sapphire wafer W is divided by the dividing method according to this preferred embodiment to thereby improve the luminance of each light emitting device 411 divided from the sapphire wafer W.

Figure 7A:
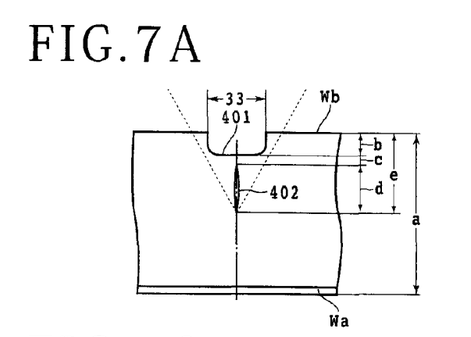
FIGS. 7A to 7C are side views for illustrating the relation between the blade width of a cutting blade and the luminance of each light emitting device.
Figure 7B:
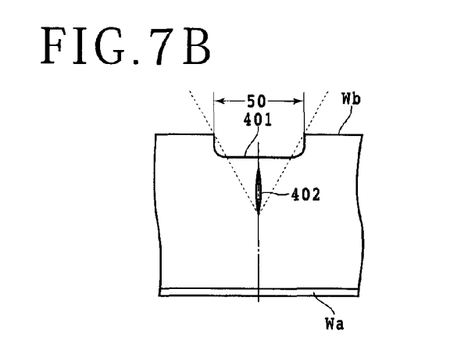
Figure 7C:
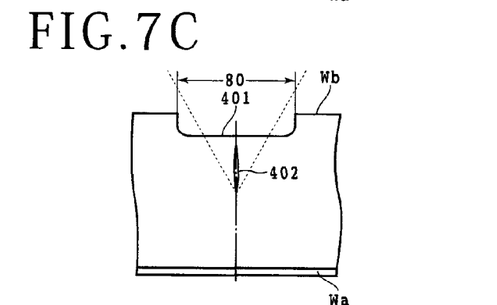
Figure 7D:
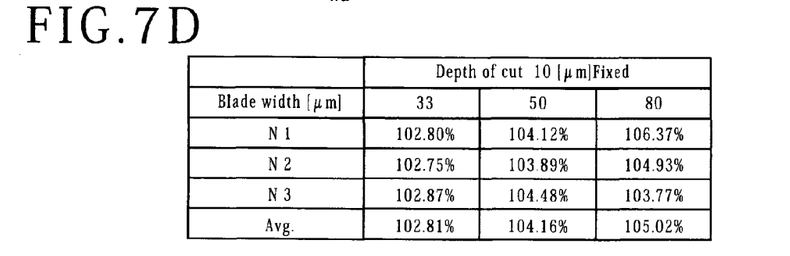
FIGS. 7D and 7E are a table and a graph, respectively, for illustrating the relation between the blade width and the luminance.
Figure 7E:
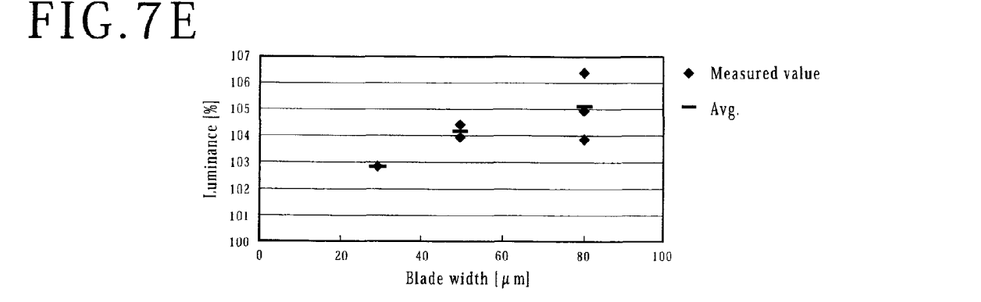

The relation between the blade width of the cutting blade 111 (the width of each cut groove 401) and the luminance of each light emitting device 411 will now be described with reference to FIGS. 7A to 7E. As shown in FIGS. 7A to 7C, three kinds of cutting blades 111 having different blade widths of 33 μm, 50 μm, and 80 μm were used to prepare three kinds of light emitting devices 411 under the following processing conditions and to measure the luminance of these light emitting devices 411. In this example, the modified layer forming step, the cut groove forming step, and the dividing step were performed in this order, and each light emitting device 411 was formed so as to have a chip size of 0.25×0.27 mm.
(Positional Information)
   Thickness (a) of sapphire wafer: 100 μm
   Depth (b) of cut from the back surface of sapphire wafer: 10 μm
   Distance (c) from the flat surface of cut groove to modified layer: 5 to 10 μm
   Height (d) of modified layer: 20 to 25 μm
   Depth (e) of the focal point from the back surface of sapphire wafer: 40 μm
(Cutting Conditions)
   Type of blade: nickel plated blade using diamond abrasive grains
   Grain size: #2000
   Rotational speed: 20000 rpm
   Feed speed: 100 mm/sec
(Laser Processing Conditions)
   Wavelength: 1064 nm
   Repetition frequency: 100 kHz
   Power: 0.3 W
   Feed speed: 400 mm/s The results of measurement shown in FIGS. 7D and 7E were obtained. The values shown in FIGS. 7D and 7E are values in the case that the luminance of each light emitting device 411 divided from the sapphire wafer W formed with only the modified layers 402 is 100%. It is understood that by forming the cut grooves 401 on the sapphire wafer W as shown in FIGS. 7A to 7C, the chamfered portions Wd are formed at the corners of the back surface Wb of each light emitting device 411, thereby improving the luminance. It is also understood that the larger the blade width, the larger the degree of the improvement in luminance of each light emitting device 411. That is, by increasing the width of each chamfered portion Wd of each light emitting device 411, the area of a reflective surface of each chamfered portion Wd inhibiting the preservation of a reflective angle can be increased to improve the luminance.

In the case that the modified layer forming step is performed after performing the cut groove forming step, the width of the flat surface 401a of each cut groove 401 in the cut groove forming step is preferably set larger than the diameter of a laser spot to be formed in the modified layer forming step, so that the focusing accuracy of the laser beam can be improved to thereby improve the yield of each light emitting device 411. In view of the relation between the above results, the processing conditions for the modified layer forming step, and the manufacturing yield of the cutting blade, the blade width is set to preferably 30 to 300 μm, more preferably 30 to 200 μm, and further more preferably 50 to 100 μm. An actual value for the blade width is suitably selected from the above range according to chip size or wafer thickness.

According to the dividing method in this preferred embodiment mentioned above, the cut grooves 401 are formed on the sapphire wafer W along the division lines in the cut groove forming step to thereby chamfer the corners of the back surface of each light emitting device 411 divided from the sapphire wafer W in the dividing step. By this chamfering, a polyhedral shape is formed on the back surface of each light emitting device 411, so that the light reflected in the device 411 is easily incident on the polyhedral surface at an angle less than or equal to the critical angle. Accordingly, the light emitted from the light emitting layer 412 is easily emerged to the outside of the device 411, thereby improving the luminance of the device 411.

There will now be described a modification of the above preferred embodiment of the dividing method according to the present invention with reference to FIGS. 8A to 8D. The dividing method according to this modification is different from the dividing method according to the above preferred embodiment in only the point that a preliminary groove forming step is added. Accordingly, only the different point will be mainly described. As shown in FIGS. 8A to 8D, the sapphire wafer W is divided by sequentially performing a preliminary groove forming step using a laser processing apparatus, a cut groove forming step using the cutting apparatus 101, a modified layer forming step using the laser processing apparatus 201, and a dividing step using the tape expanding apparatus 301. The laser processing apparatus used in the preliminary groove forming step may have any configuration capable of performing ablation to the sapphire wafer W. For example, the laser processing apparatus used in the preliminary groove forming step may be similar to the laser processing apparatus 201 used in the modified layer forming step.

Figure 8A:
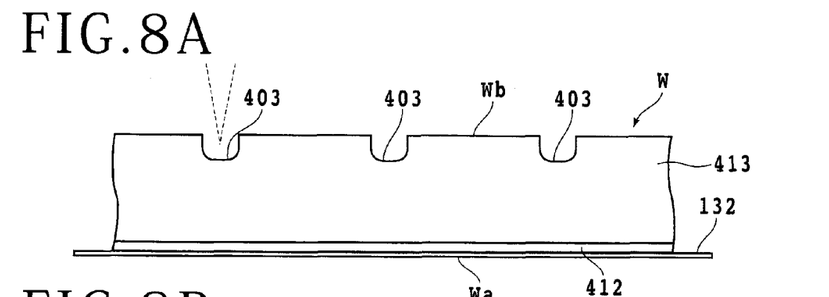
FIGS. 8A to 8D are side views for illustrating a modification of the dividing method according to the present invention.

As shown in FIG. 8A, the preliminary groove forming step is first performed by the laser processing apparatus. For example, a laser beam having a wavelength of 355 nm, a power of 1.5 W, and a repetition frequency of 100 kHz is used. In this preliminary groove forming step, the back surface Wb of the sapphire wafer W is ablated by the laser beam to thereby form a plurality of preliminary grooves 403 along the division lines. The surface of each preliminary groove 403 formed by this ablation has a melted portion having minute unevenness.

Figure 8B:
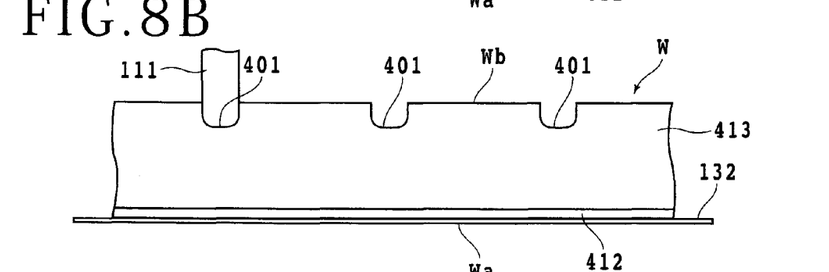

As shown in FIG. 8B, the cut groove forming step is next performed by the cutting apparatus 101. In this cut groove forming step, the surface of each preliminary groove 403 is wiped (finished) by the cutting blade 111 under the above-mentioned cutting conditions to thereby remove the melted portion of each preliminary groove 403 and form a plurality of cut grooves 401 respectively corresponding to the preliminary grooves 403 on the back surface Wb of the sapphire wafer W. By the removal of the melted portion generated by the ablation, light can be effectively emerged through each cut groove 401 to the outside. Further, in the dividing method according to this modification, the amount of cutting by the cutting blade 111 can be reduced by performing the ablation prior to the cut groove forming step, so that the wearing of the cutting blade 111 can be suppressed in spite of the fact that the hardness of the sapphire wafer W is large. Further, a change in shape of the front end of the cutting blade 111 due to partial wear can also be suppressed.

Figure 8C:
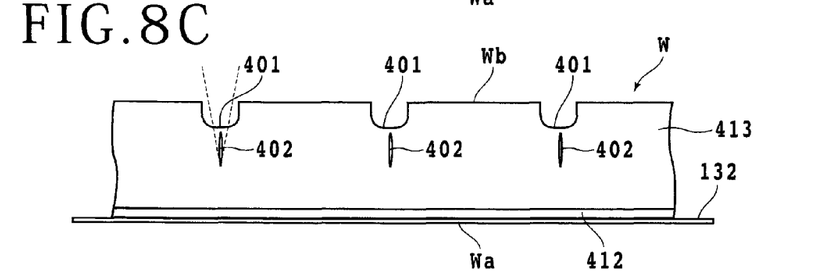
Figure 8D:
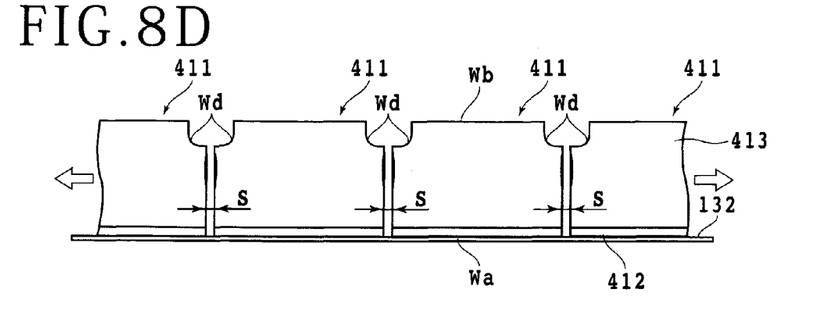

As shown in FIG. 8C, the modified layer forming step is next performed by the laser processing apparatus 201. In the modified layer forming step, a plurality of modified layers 402 are formed inside the sapphire wafer W along the division lines. As shown in FIG. 8D, the dividing step is next performed by the tape expanding apparatus 301. In the dividing step, a tensile force is radially applied to the dicing tape 132 to thereby divide the sapphire wafer W along the modified layers 402 as a division start point, thus obtaining the individual light emitting devices 411. As similar to the above preferred embodiment, each light emitting device 411 is improved in luminance owing to the chamfering of the back surface Wb.

According to the above modification, the preliminary grooves 403 are first formed by ablation. Accordingly, although the hardness of the sapphire wafer W is large, the wearing of the cutting blade 111 in forming the cut grooves 401 can be suppressed. Further, the back surface of each light emitting device 411 is chamfered, so that the light emitted from the light emitting layer 412 of each light emitting device 411 can be easily emerged to the outside of the device 411, thereby improving the luminance.

Figure 9A:
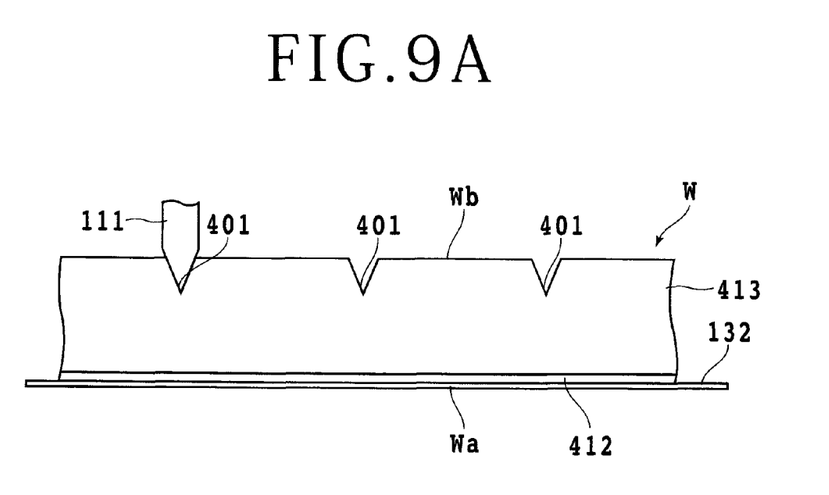
FIGS. 9A and 9B are side views for illustrating another modification of the dividing method according to the present invention.
Figure 9B:
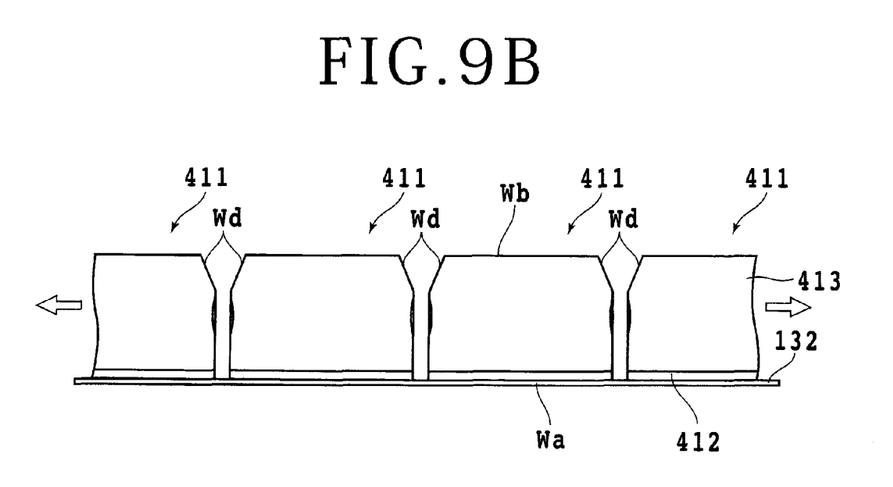

While the front end of the cutting blade 111 has a flat surface in the above preferred embodiment and the modification, the front end of the cutting blade 111 is not limited to this configuration. That is, the bottom surface of each cut groove may not have a flat surface. For example, a bevel blade as shown in FIG. 9A may be used as the cutting blade 111. In this case, a plurality of V-shaped cut grooves 401 are formed on the back surface Wb of the sapphire wafer W as shown in FIG. 9A. When the sapphire wafer W having such V-shaped cut grooves 401 is divided as shown in FIG. 9B, the corners of each light emitting device 411 are beveled by the V-shaped cut grooves 401. In this manner, each cut groove 401 may not have a flat surface, but may have a reflective surface capable of inhibiting the preservation of a reflective angle.

While the sapphire wafer W is divided by the tape expanding apparatus 301 in the preferred embodiment and the modification mentioned above, the tape expanding apparatus used in the dividing step according to the present invention is not limited to the above configuration. That is, the dividing step may be performed by any apparatus capable of dividing the sapphire wafer by applying an external force other than the tape expanding apparatus 301.

While the modified layer forming step is performed after performing the cut groove forming step in the preferred embodiment and the modification mentioned above, the present invention is not limited to this configuration. That is, the cut groove forming step may be performed after performing the modified layer forming step.

The preferred embodiment mentioned above is merely illustrative in all respects, and the present invention is not limited to this preferred embodiment. The scope of the present invention is shown by the claims rather than the description of the preferred embodiment, and all changes and modifications within the equivalence of the scope of the claims are intended to be included in the present invention.

As described above, the present invention has an effect such that the luminance of each light emitting device formed by dividing a sapphire wafer can be improved. In particular, the present invention is useful for a dividing method of dividing a sapphire wafer into individual light emitting devices.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A sapphire wafer dividing method for dividing a sapphire wafer along a plurality of crossing division lines, said sapphire wafer having a light emitting layer on the front side, said light emitting layer being partitioned by said division lines to define a plurality of regions where a plurality of light emitting devices are respectively formed, said sapphire wafer dividing method comprising:

a modified layer forming step of applying a laser beam having a transmission wavelength to said sapphire wafer from the back side of said sapphire wafer along said plurality of crossing division lines to thereby form a plurality of modified layers inside said sapphire wafer along said plurality of crossing division lines;

a cut groove forming step of cutting said sapphire wafer from the back side thereof by using a cutting blade to thereby form a plurality of cut grooves along said plurality of crossing division lines, thereby chamfering said back side of said sapphire wafer on each light emitting device; and a dividing step of dividing said sapphire wafer into said individual light emitting devices along said plurality of crossing division lines from said plurality of modified layers as a division start point after performing said modified layer forming step and said cut groove forming step.

2. The sapphire wafer dividing method according to claim 1, further comprising a preliminary groove forming step of performing ablation by applying a laser beam having an absorption wavelength to said sapphire wafer before performing said cut groove forming step to thereby form a plurality of preliminary grooves from the back side of said sapphire wafer along said plurality of crossing division lines.

3. The sapphire wafer dividing method according to claim 1, wherein said modified layer forming step is performed after performing said cut groove forming step.

* * * * *